United States Patent
Kwak

(10) Patent No.: US 8,354,980 B2
(45) Date of Patent: Jan. 15, 2013

(54) ORGANIC LIGHT EMITTING DISPLAY

(75) Inventor: Won-Kyu Kwak, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 310 days.

(21) Appl. No.: 12/564,004

(22) Filed: Sep. 21, 2009

(65) Prior Publication Data

US 2010/0097295 A1    Apr. 22, 2010

(30) Foreign Application Priority Data

Oct. 17, 2008   (KR) .................. 10-2008-0101947

(51) Int. Cl.
*G09G 3/30* (2006.01)
*G09G 3/32* (2006.01)

(52) U.S. Cl. .................. 345/76; 345/82; 313/506

(58) Field of Classification Search .................. None
See application file for complete search history.

(56) References Cited

U.S. PATENT DOCUMENTS

| 7,812,523 | B2 | 10/2010 | Jung et al. |
|---|---|---|---|
| 2004/0263441 | A1 | 12/2004 | Tanaka et al. |
| 2005/0212413 | A1* | 9/2005 | Matsuura et al. ............ 313/504 |
| 2006/0124950 | A1 | 6/2006 | Park et al. |
| 2006/0158095 | A1 | 7/2006 | Imamura |
| 2006/0273712 | A1 | 12/2006 | Yaegashi |
| 2007/0108899 | A1 | 5/2007 | Jung et al. |

FOREIGN PATENT DOCUMENTS

| CN | 1578571 A | 2/2005 |
|---|---|---|
| CN | 1967864 A | 5/2007 |
| JP | 2003-068472 | 3/2003 |
| JP | 2004-281399 | 10/2004 |
| JP | 2005-011793 | 1/2005 |
| JP | 2005-268062 | 9/2005 |
| JP | 2006-059796 | 3/2006 |
| JP | 2006-201421 | 8/2006 |
| JP | 2006-318776 | 11/2006 |
| JP | 2007095518 | 4/2007 |
| JP | 2007-141844 | 6/2007 |
| JP | 2007-273261 | 10/2007 |
| KR | 1020020029159 A | 4/2002 |
| KR | 10-2003-0013700 | 2/2003 |
| KR | 20060030437 A | 4/2006 |

(Continued)

OTHER PUBLICATIONS

SIPO Office Action dated Jan. 19, 2011 in corresponding Chinese patent application No. CN 200910179535.9, 7 pps.

(Continued)

*Primary Examiner* — Andrew L Sniezek
(74) *Attorney, Agent, or Firm* — Christie, Parker & Hale, LLP

(57) ABSTRACT

An organic light emitting display is capable of reducing or preventing IR drop in a cathode electrode. An organic light emitting display includes a first substrate and a second substrate. The first substrate has a plurality of pixels located thereon, each of the pixels comprising an organic light emitting diode, wherein a cathode electrode of the organic light emitting diode including a transparent material is located on substantially an entire area of the pixels. The second substrate has a mesh type auxiliary electrode located thereon at a side facing the pixels, the mesh-type auxiliary electrode corresponding to non-emission regions between the pixels and electrically connected to the cathode electrode.

14 Claims, 3 Drawing Sheets

FOREIGN PATENT DOCUMENTS

| | | |
|---|---|---|
| KR | 10-0662557 | 12/2006 |
| KR | 10-2008-0025500 | 3/2008 |

OTHER PUBLICATIONS

European Search Report dated Feb. 9, 2010, for corresponding European patent application 09173041.6, noting listed references in this IDS.

Japanese Office action dated Jan. 4, 2011 for Japanese Patent Application No. 2009-100002, which claims priority of the corresponding Korean priority application No. 10-2008-0101947, noting the listed references in this IDS.

KIPO Office action dated May 31, 2010, for priority Korean Patent Application No. 10-2008-0101947, noting the listed references in this IDS, as well as KR 100662557, KR 1020030013700 and KR 1020080025500 previously filed in an IDS dated Jan. 28, 2010.

KIPO Office action dated Dec. 23, 2009, for priority Korean application 10-2008-0101947, noting listed references in this IDS.

Japanese Office action dated Apr. 3, 2012, for corresponding Japanese Patent application 2009-100002, (3 pages).

\* cited by examiner

ORGANIC LIGHT EMITTING DISPLAY

CROSS-REFERENCE TO RELATED APPLICATION

This application claims priority to and the benefit of Korean Patent Application No. 10-2008-0101947, filed on Oct. 17, 2008, in the Korean Intellectual Property Office, the entire content of which is incorporated herein by reference.

BACKGROUND OF THE INVENTION

1. Field of the Invention

The present invention relates to an organic light emitting display, and more particularly, to an organic light emitting display in which IR drop (i.e., voltage drop) in a cathode electrode is prevented or reduced.

2. Description of the Related Art

Recently, various flat panel displays (FPDs) that are light and thin in comparison to cathode ray tubes (CRTs) have been developed. Among the FPDs, organic light emitting displays using organic compound as phosphor to have excellent brightness and color purity are in the spotlight.

Since the organic light emitting displays are thin and light and capable of being driven with low power consumption, they are suitable for portable displays in addition to applications in larger size FPDs.

The organic light emitting displays are typically classified as a top emission organic light emitting display or a bottom emission organic light emitting display according to light emission directions. Further, a dual-side emission organic light emitting display has combined features of the top emission organic light emitting display and the bottom emission organic light emitting display.

A conventional bottom emission organic light emitting display has disadvantages of a low aperture ratio because thin film transistors for driving OLEDs cannot be positioned at light emitting regions.

On the contrary, the top emission organic light emitting display can achieve a desired aperture ratio regardless of whether or not the thin film transistors are located under the OLEDs.

However, in the top emission organic light emitting display, as light generated from an emission layer of the OLED is emitted out through a cathode electrode, the cathode electrode is required to be transparent. Therefore, the cathode electrode is made of a transparent conductive material such as ITO, or MgAg having a sufficiently small thickness to be transparent.

However, the transparent conductive material such as ITO has a high resistance, and MgAg can only have a limited thickness. Thus, resistance of the cathode electrode is high so that a relatively high IR drop (i.e., voltage drop) occurs. Particularly, as a display panel becomes larger in size, IR drop in the cathode electrode is greatly increased so that image quality and display characteristics may not be uniform.

SUMMARY OF THE INVENTION

Accordingly, it is an aspect according to embodiments of the present invention to provide an organic light emitting display in which IR drop in a cathode electrode can be reduced or prevented.

In order to achieve the foregoing and/or other aspects of the present invention, according to a first embodiment of the present invention, an organic light emitting display including a first substrate and a second substrate is provided. The first substrate has a plurality of pixels located thereon, each of the pixels including an organic light emitting diode, wherein a cathode electrode of the organic light emitting diode including a transparent material is located on substantially an entire area of the pixels. The second substrate has a mesh type auxiliary electrode located thereon at a side facing the pixels, the mesh-type auxiliary electrode corresponding to non-emission regions between the pixels and electrically connected to the cathode electrode.

Here, the auxiliary electrode may include a conductive black matrix material.

The auxiliary electrode may include a material with a lower specific resistance than a material for the cathode electrode.

The organic light emitting display further includes a transparent conductive layer on substantially an entire area of the auxiliary electrode and contacting the cathode electrode to electrically connect the auxiliary electrode to the cathode electrode. The transparent conductive layer contacts the cathode electrodes at the non-emission regions between the pixels.

Accordingly, in organic light emitting displays according to embodiments of the present invention, since an auxiliary electrode, electrically connected to a cathode electrode on a lower substrate and having resistance lower than the cathode electrode, is on an upper substrate, IR drop in the cathode electrode can be reduced or prevented.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
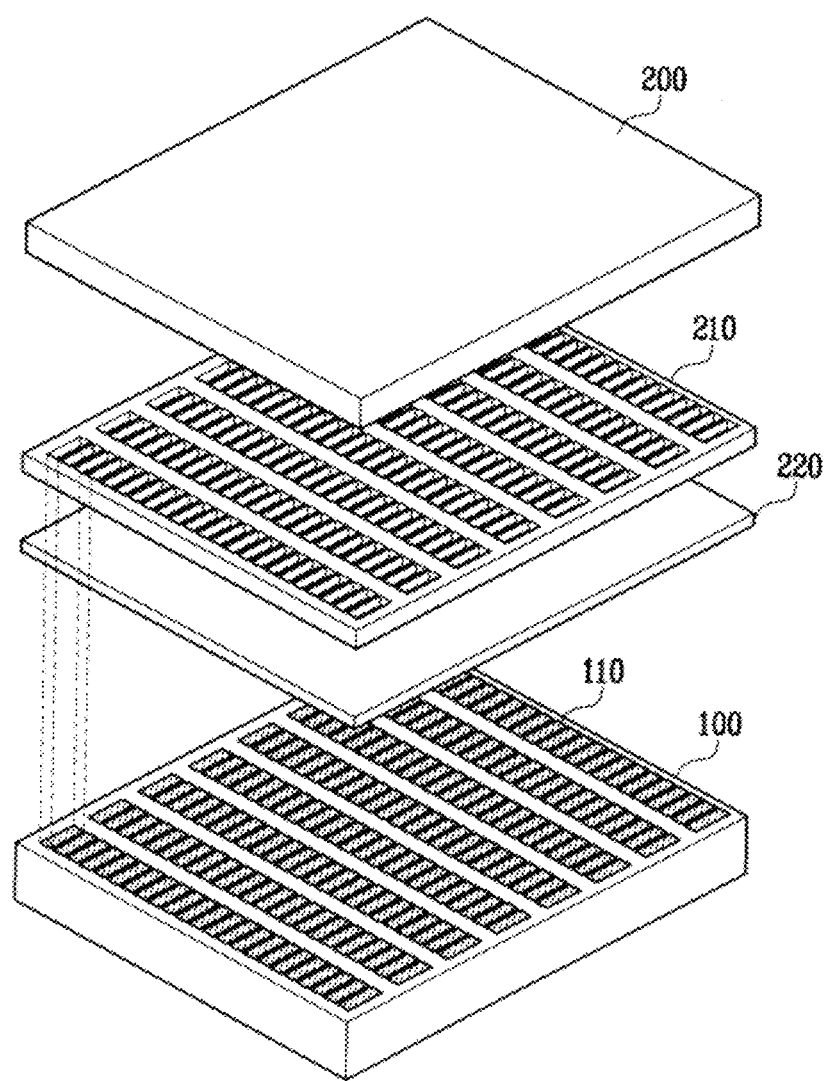
FIG. 1 is an exploded perspective view illustrating an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to a complete understanding of the invention are omitted for clarity. Also, like reference numerals refer to like elements throughout.

Hereinafter, exemplary embodiments of the present invention will be described in detail with reference to the accompanying drawings, namely, FIGS. 1 to 3.

Figure 2:
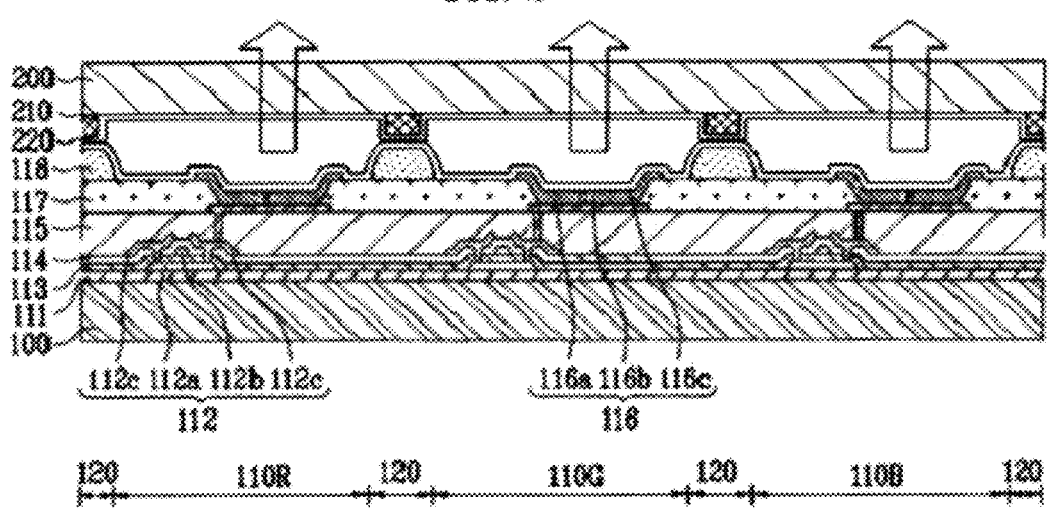
FIG. 2 is a sectional view illustrating main parts of the organic light emitting display as shown in FIG. 1.

FIG. 1 is an exploded perspective view illustrating an organic light emitting display according to an embodiment of the present invention, and FIG. 2 is a sectional view illustrating main parts of the organic light emitting display as shown in FIG. 1.

Referring to FIG. 1, an organic light emitting display according to an embodiment of the present invention includes a lower substrate 100 on which a plurality of pixels 110 respectively including organic light emitting diodes (OLEDs) are formed, an upper substrate 200 on which a mesh-type auxiliary electrode 210 is located at the side facing the pixels 110. A transparent conductive layer 220 is formed on substantially an entire area of the auxiliary electrode 210 at the side facing the pixels 110. While the auxiliary electrode 210 is primarily described herein as a single electrode formed as a mesh as shown in FIG. 1, the auxiliary electrode can also be viewed as a plurality of auxiliary electrodes that are electrically connected together in a form of a mesh.

Each of the pixels 110, as illustrated in FIG. 2, includes a thin film transistor 112 and an OLED 116 which are formed on the lower substrate 100.

Each of the thin film transistors 112 includes a semiconductor layer 112a formed on a buffer layer 111, which is on the lower substrate 100, a gate electrode 112b formed on the semiconductor layer 112a, where an insulating layer 113 is interposed between the gate electrode 112b and the semiconductor layer 112a, and source/drain electrodes 112c formed on the gate electrode 112b, where an interlayer insulating layer 114 is interposed between the source/drain electrodes 112c and the gate electrode 112b. The source/drain electrodes 112c are electrically connected to the semiconductor layer 112a.

An insulating planarization layer 115 is formed on the thin film transistor 112. An OLED 116 connected to the thin film transistor 112 through a via-hole is formed on the planarization layer 115.

The OLED 116 is formed on the planarization layer 115. The OLED 116 includes an anode electrode 116a electrically connected to the thin film transistor 112 through the via-hole formed in the planarization layer 115, a light emission layer 116b formed on the anode electrode 116a at an area exposed by a pixel definition layer 117 which is formed on the planarization layer 115 to overlap with an upper portion of an edge of the anode electrode 116a, and a cathode electrode 116c formed on the light emission layer 116b and made of transparent material. The cathode electrode layer 116c is formed over substantially an entire upper side of the pixels 110.

Here, the light emission layer 116b may be formed in the form of a red light emission layer R, a green light emission layer G, or a blue light emission layer B, independently deposited using a fine metal mask (FMM). According to kind of the light emission layer 116b, the pixels 110 may be classified as a red pixel 110R, a green pixel 110G, or a blue pixel 110B.

Each of the pixels 110 includes the cathode electrode 116c made of a transparent material to emit light toward the cathode electrode 116c. Accordingly, the organic light emitting display may be implemented as a top emission (or a dual-side emission) organic light emitting display. In the described embodiment, the cathode electrode is a common electrode shared by all of the pixels. However, each pixel can also be viewed as having its own cathode electrode that is electrically connected to cathode electrodes of other pixels.

Since the cathode electrode 116c should transmit light in a top emission or dual-side emission organic light emitting display, the cathode electrode 116c is made of a transparent conductive layer. To this end, the cathode electrode 116c is made of a transparent conductive material such as ITO, or MgAg having a thickness that is small enough to be transparent. Here, the thickness of MgAg is determined within a range of guaranteeing transparency greater than a predetermined transparency with respect to light. The term transparency or transparent in the present application refers to translucency greater than a desired transparency (e.g., predetermined transparency) or substantial transparency, as well as a transparency of 100%.

In non-emission regions 120 between the pixels 110, spacers 118 are provided to maintain a gap (e.g., a predetermined gap) between the first substrate 100 and the second substrate 200.

Each of the spacers 118 is formed between the pixel definition layer 117 of the non-emission region 120 and the cathode electrode 116c. In other words, the cathode electrode 116c is formed in a region including an upper portion of the spacer 118 of the non-emission region 120, that is, is positioned on the top of the lower substrate 100.

The auxiliary electrode 210 is formed at a side of the upper substrate 200 facing the pixels 110 to correspond to the non-emission region 120 between the pixels 110 in the form of a mesh, and is electrically connected to the cathode electrode 116c of the lower substrate 100 by a transparent conductive layer 220.

The auxiliary electrode 210 may function as a black matrix containing conductive black matrix material. The conductive black matrix material may be at least one selected from the group consisting of chrome (Cr), chrome alloys, molybdenum (Mo), molybdenum alloys, oxides thereof (CrOx, MoOx), and combinations thereof. For example, the auxiliary electrode 210 may be formed of a single chrome layer, or may include a dual chrome layer/chrome oxide layer or a dual molybdenum layer/molybdenum oxide layer for effective light interception.

Moreover, even if the auxiliary electrode 210 does not completely function as a black matrix, since it is formed in the non-emission region 120, it does not necessarily have to be transparent. Thus, the thickness of the auxiliary electrode 210 has less restriction than that of the cathode electrode 116c. Therefore, the auxiliary electrode 210 may be formed with a thickness relatively greater than that of the cathode electrode 116c.

When the cathode electrode 116c is formed as a transparent electrode made of ITO, for example, the auxiliary electrode 210 may be made of one of a variety of materials having a specific resistance lower than the material for the cathode electrode 116c.

That is, the auxiliary electrode 210 has a resistance lower than that of the cathode electrode 116c and is electrically connected thereto so as to prevent or reduce IR drop in the cathode electrode 116c.

The transparent conductive layer 220 is formed on substantially an entire area of the auxiliary electrode 210 and contacts the cathode electrode 116c at the non-emission regions 120 between the pixels 110 to electrically connect the auxiliary electrode 210 to the cathode electrode 116c.

The transparent conductive layer 220 performs a function of preventing or reducing IR drop in the cathode electrode 116c together with the auxiliary electrode 210, and may be made of indium tin oxide (ITO) such that light can be transmitted therethrough. In other embodiments of the present invention, the transparent conductive layer 220 may not be provided, and the auxiliary electrode 210 may directly contact the cathode electrode 116c when the transparent electrode 220 is not used.

As described above, according to embodiments of the present invention, the auxiliary electrode 210 and/or the transparent conductive layer 220 to be electrically connected to the cathode electrode 116c on the lower substrate 100, are formed on the upper substrate 200. Then, the two substrates 100 and 200 are bonded to each other. Accordingly, IR drop in the cathode electrode 116c can be prevented or reduced.

Figure 3:
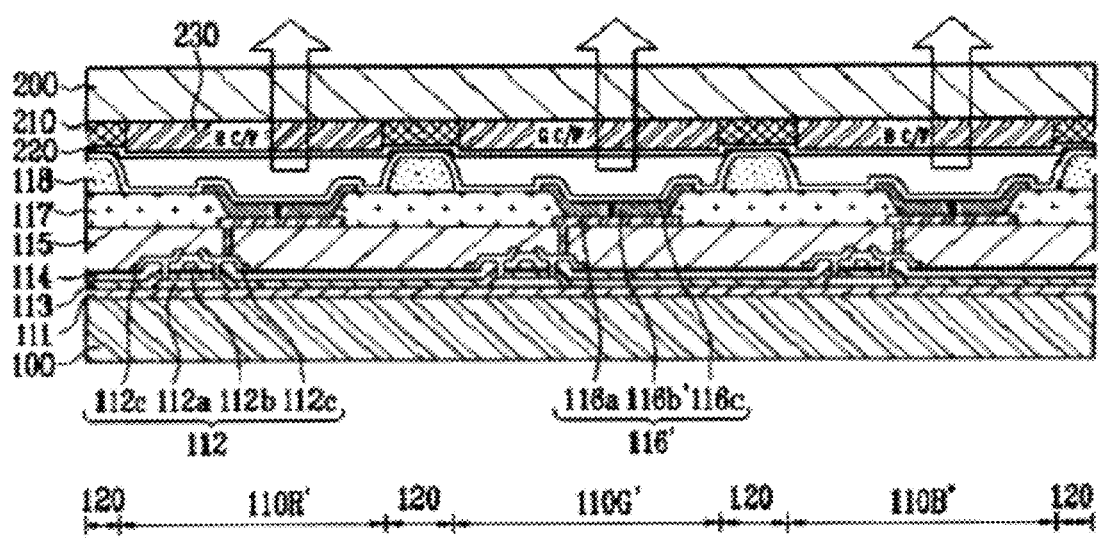
FIG. 3 is a sectional view illustrating main parts of an organic light emitting display according to another embodiment of the present invention.

FIG. 3 is a sectional view illustrating main parts of an organic light emitting display according to another embodiment of the present invention. In FIG. 3, same reference numerals are assigned to the same elements as those in FIG. 2 and their description will be omitted.

Referring to FIG. 3, in an organic light emitting display according to another embodiment of the present invention, each of OLEDs 116' or a red pixel 110R', a green pixel 110G', and a blue pixel 110B' includes white light emitting layer W.

Between the auxiliary electrode 210 of the upper substrate 200, color filters 230 corresponding to the pixels 110R', 110G', and 110B' are provided. Here, color filters are located at openings of the mesh-type auxiliary electrode 210. That is, red color filters R C/F, green color filters G C/F, and blue color filters B C/F are formed on the red pixels 110R', the green pixels 110G', and the blue pixels 110B', respectively. Using the color filters, the organic light emitting display displays an image with full colors.

Although not shown in the drawings, when unit pixels include a red pixel, a green pixel, a blue pixel, and a white pixel to display an image with full colors, the white pixel may not include a color filter or may include a filter for adjusting the amount of transmitted light.

This way, in another embodiment, the transparent conductive layer 220 is formed on substantially an entire area of the auxiliary electrode 210 and color filters 230 and contacts the cathode electrodes 116c to electrically connect the auxiliary electrode 210 to the cathode electrodes 116c.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
a first substrate having a plurality of pixels located thereon, each of the pixels comprising an organic light emitting diode, wherein a cathode electrode of the organic light emitting diode comprising a transparent material is located on substantially an entire area of the pixels;
a second substrate having a mesh-type auxiliary electrode located thereon at a side facing the pixels, the mesh-type auxiliary electrode corresponding to non-emission regions between the pixels and electrically connected to the cathode electrode; and
a transparent conductive layer contacting an entire area of the second substrate exposed by the auxiliary electrode and contacting the cathode electrode to electrically connect the auxiliary electrode to the cathode electrode.

2. The organic light emitting display as claimed in claim 1, wherein the auxiliary electrode comprises a conductive black matrix material.

3. The organic light emitting display as claimed in claim 1, wherein the auxiliary electrode comprises at least one material selected from the group consisting of chrome (Cr), a chrome alloy, molybdenum (Mo), a molybdenum alloy, a chrome oxide (CrOx), a molybdenum oxide (MoOx), and combinations thereof.

4. The organic light emitting display as claimed in claim 1, wherein the auxiliary electrode comprises a material with a lower specific resistance than a material for the cathode electrode.

5. The organic light emitting display as claimed in claim 1, wherein the transparent conductive layer comprises indium tin oxide (ITO).

6. The organic light emitting display as claimed in claim 1, wherein the transparent conductive layer contacts the cathode electrode at the non-emission regions between the pixels.

7. The organic light emitting display as claimed in claim 1, wherein the organic light emitting diode comprises a light emission layer for emitting a red light, a green light, or a blue light.

8. The organic light emitting display as claimed in claim 1, wherein the organic light emitting diode comprises a light emission layer for emitting a white light.

9. The organic light emitting display as claimed in claim 8, further comprising red color filters, green color filters, and blue color filters respectively located at openings of the auxiliary electrode to correspond to the pixels.

10. An organic light emitting display comprising:
a first substrate having a plurality of pixels located thereon, each of the pixels comprising an organic light emitting diode comprising a light emission layer for emitting a white light, wherein a cathode electrode of the organic light emitting diode comprising a transparent material is located on substantially an entire area of the pixels;
a second substrate having a mesh-type auxiliary electrode located thereon at a side facing the pixels, the mesh-type auxiliary electrode corresponding to non-emission regions between the pixels and electrically connected to the cathode electrode;
red color filters, green color filters, and blue color filters respectively located at openings of the auxiliary electrode to correspond to the pixels; and
a transparent conductive layer on the auxiliary electrode and the color filters and contacting the cathode electrode to electrically connect the auxiliary electrode to the cathode electrode,
wherein the transparent conductive layer contacts substantially an entire area of the auxiliary electrode and the color filters facing the first substrate.

11. An organic light emitting display comprising:
a first substrate;
a second substrate facing the first substrate with a gap therebetween;
a plurality of organic light emitting diodes (OLEDs) on the first substrate, the OLEDs sharing a common electrode comprising a substantially transparent material, each of the OLEDs comprising a pixel electrode and a light emission layer between the pixel electrode and the common electrode;
a plurality of thin film transistors on the first substrate and electrically connected to the OLEDs;
an auxiliary electrode on the second substrate at non-emission regions between the OLEDs and electrically connected to the common electrode to reduce a resistance across the common electrode; and
a transparent conductive layer contacting an entire area of the second substrate exposed by the auxiliary electrode and contacting the common electrode to electrically connect the auxiliary electrode to the common electrode.

12. The organic light emitting display of claim 11, wherein the auxiliary electrode is a mesh-type electrode having openings corresponding to the OLEDs.

13. The organic light emitting display of claim 12, further comprising a plurality of color filters at the openings of the mesh-type electrode.

14. The organic light emitting display of claim 11, wherein the transparent conductive layer is between the auxiliary electrode and the common electrode.

* * * * *

UNITED STATES PATENT AND TRADEMARK OFFICE
CERTIFICATE OF CORRECTION

| | | |
|---|---|---|
| PATENT NO. | : 8,354,980 B2 | Page 1 of 1 |
| APPLICATION NO. | : 12/564004 | |
| DATED | : January 15, 2013 | |
| INVENTOR(S) | : Won-Kyu Kwak | |

It is certified that error appears in the above-identified patent and that said Letters Patent is hereby corrected as shown below:

In the Claims

Column 5, Claim 3, line 57        Delete "thereof"
                                                           Insert -- thereof. --

Signed and Sealed this
Fifteenth Day of July, 2014

Michelle K. Lee
*Deputy Director of the United States Patent and Trademark Office*